(12) United States Patent
Gaudenz

(10) Patent No.: US 11,509,301 B2
(45) Date of Patent: Nov. 22, 2022

(54) ELECTRONIC SWITCH WITH CURRENT REGULATION

(71) Applicant: Siemens Aktiengesellschaft, Munich (DE)

(72) Inventor: Markus Matthias Gaudenz, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/430,273

(22) PCT Filed: Feb. 12, 2020

(86) PCT No.: PCT/EP2020/053543
§ 371 (c)(1),
(2) Date: Aug. 11, 2021

(87) PCT Pub. No.: WO2020/165215
PCT Pub. Date: Aug. 20, 2020

(65) Prior Publication Data
US 2022/0094348 A1    Mar. 24, 2022

(30) Foreign Application Priority Data
Feb. 15, 2019 (EP) .................................... 19157443

(51) Int. Cl.
*H03K 17/082* (2006.01)
(52) U.S. Cl.
CPC .................... *H03K 17/082* (2013.01)
(58) Field of Classification Search
CPC . H03K 17/082; H03K 17/166; H03K 17/0822
(Continued)

(56) References Cited

U.S. PATENT DOCUMENTS 5,583,422 A * 12/1996 Schirmer ............ H01F 17/0013
323/224
2003/0063420 A1   4/2003 Pahl et al.
(Continued)

FOREIGN PATENT DOCUMENTS

DE    10 2012 203 995 A1    9/2012
DE    10 2014 107 043 A1    11/2015
(Continued)

OTHER PUBLICATIONS

PCT International Search Report and Written Opinion of International Searching Authority dated May 13, 2020 corresponding to PCT International Application No. PCT/EP2020/053543 filed Feb. 12, 2020.

*Primary Examiner* — Kevin J Comber
(74) *Attorney, Agent, or Firm* — Henry M. Feiereisen LLC

(57) ABSTRACT

An electronic switch includes a current sensor and a semiconductor switch having two semiconductors configured to carry and disconnect a current in both directions, and a control circuit configured to operate the semiconductor switch by pulse-width modulation and to determine a phase control factor of the pulse-width modulation as a function of measurement values of the current sensor such that in fault-free operation, the electronic switch remains in the ON state and that two limit values exist for protection. The electronic switch is operated by pulse-width modulation when a first one of the two limit values is exceeded, and the electronic switch is switched off when a second one of the two limit values, which is greater than the first limit value, is exceeded. The electronic switch is configured to reduce an edge steepness of a switching edge as the phase control factor decreases.

8 Claims, 3 Drawing Sheets

(58) Field of Classification Search
USPC .......................................................... 361/93.1
See application file for complete search history.

(56) References Cited

U.S. PATENT DOCUMENTS

| | | |
|---|---|---|
| 2007/0013361 A1 | 1/2007 | Theytaz et al. |
| 2012/0235661 A1 | 9/2012 | Roessler et al. |
| 2015/0357914 A1 | 12/2015 | Ozanoglu et al. |
| 2018/0351459 A1* | 12/2018 | Liu ........................ H03K 4/48 |
| 2021/0091561 A1 | 3/2021 | Schierling et al. |

FOREIGN PATENT DOCUMENTS

| | | | |
|---|---|---|---|
| EP | 1 298 770 A2 | 4/2003 | |
| EP | 1 739 833 A2 | 1/2007 | |
| EP | 2 953 248 A1 | 12/2015 | |
| WO | WO-2014139559 A1 * | 9/2014 | ....... H03K 17/08148 |
| WO | WO 2019-011642 A1 | 1/2019 | |

* cited by examiner

ELECTRONIC SWITCH WITH CURRENT REGULATION

CROSS-REFERENCES TO RELATED APPLICATIONS

This application is the U.S. National Stage of international Application No. PCT/EP2020/053543, filed Feb. 12, 2020, which designated the United States and has been published as International Publication No. WO 2020/165215 A1 and which claims the priority of European Patent Application, Serial No. 19157443.3, filed Feb. 15, 2019, pursuant to 36 U.S.C. 119(a)-(d).

BACKGROUND OF THE INVENTION

The Invention relates to an electronic switch having a semiconductor switch comprising a control circuit. The invention further relates to a power supply system having an electronic switch of this type. The invention further relates to a method for operating an electronic switch of this type or a power supply system of this type.

One way in which switches are currently used is to enable electrical consumer loads to be isolated from the network in power supply systems. With the aid of the switch it is likewise possible to disconnect parts of a power supply network or to connect different parts of the power supply system together or isolate them from one another. The isolation can in this case be carried out for operational reasons or else to protect components of the power supply system when a fault occurs. In this case the switch can be used for example to isolate a chain or multiple chains, each comprising one or more electrical consumer loads connected thereto, from the power source or the power sources of the power supply system.

At present, when a fault occurs the relevant part is isolated from the power supply system to enable the remaining part of the power supply system to be kept in operation. Both mechanical and electronic switches can be used for this purpose.

Power supply systems are currently usually designed as AC networks. Different voltage levels can then easily be realized by means of transformers. The protection of individual outgoing circuits or of the individual voltage levels is in this case usually realized using mechanical switches. In this case a conductive connection is created in an ON state, also known as the switched-on state or conductive state, whereas the input and output terminals of the switch are electrically isolated from one another in the OFF state, also known as the switched-off or nonconductive state. Switching between ON and OFF states is effected in the mechanical switch by the movement of a conductive element.

Besides mechanical switches, switches based on semiconductor switches are also known. These switches are known as electronic switches. They are characterized in that they can switch very quickly. In addition, these switches do not require a current zero for the disconnection, such that these electronic switches are also in particular suitable for use in a DC network.

The task of the electronic switch is to electrically isolate the at least two terminals present from one another in order to prevent a flow of current, or to electrically connect them together in order to enable a flow of current. The inductances, in part also parasitic inductances from cables, that are present at the terminals mean that overvoltages arise at the switch and these have to be controlled. However, these do not form the subject matter of this invention. Examples of the realization of an electronic switch of this type are specified in WO 2019/011642 A1. The electronic switch should not be confused with a switching element of a power converter. Semiconductors are also used as switching elements here, and are needed to generate a predefinable voltage. However, this type of switching element of a power converter cannot automatically be used as an electronic switch.

The object of the invention is to improve an electronic switch.

SUMMARY OF THE INVENTION

This object is achieved by an electronic switch having a semiconductor switch comprising a control circuit, wherein the control circuit is designed to operate the semiconductor switch by pulse-width modulation. This object is further achieved by a power supply system having an electronic switch of this type, wherein the electronic switch connects a first part of the power supply system to a second part of the power supply system in a manner enabling isolation. This object is further achieved by a method for operating an electronic switch of this type or a power supply system of this type, wherein the semiconductor switch of the electronic switch is at least intermittently controlled by pulse-width modulation.

Further advantageous embodiments of the invention are specified in the dependent claims.

The invention is based on the knowledge that an electronic switch can be improved by being at least intermittently operated by pulse-width modulation. In this case the semiconductor switch is switched on and off with a pulse frequency. The ratio of the length of time in which the semiconductor switch is conductive to the total of the length of time in the conductive and blocked state is known as the phase control factor. The total of the length of time in the conductive and blocked state corresponds to the period duration of the pulse-width modulation or the inverse value of the pulse frequency. With a phase control factor of 0 or 0% the switch is switched off or nonconductive, with a phase control factor of 1 or 100% the switch is conductive. For all values in between, switching actions take place with the pulse frequency which bring about a voltage drop across the electronic switch and a reduction in the current through the electronic switch. The phase control factor is known as the duty factor or duty cycle.

The task of the electronic switch is to electrically isolate the at least two terminals present from one another in order to prevent or interrupt a flow of current, or to electrically connect them together in order to enable a flow of current. The cited states involve operationally desired stationary states. These two known states of the electronic switch are augmented by a further operating state in which the semiconductor switch of the electronic switch is operated by pulse-width modulation to limit the current.

The proposed switch is an electronic switch for producing and interrupting an electrical connection. This can for example involve the connection between a power source and a consumer load. Alternatively, a connection between two subnetworks in particular of a power distribution system is also possible.

The use of an electronic switch to implement switching actions, in particular protective functions, in a power supply system provides degrees of freedom. Besides the typical switching states ON and OFF of a switch, the electronic switch provides the option of using pulse-width modulation to control or regulate the electrical power transmitted through the electronic switch. Thus in the event of a fault a reduction in power or a reduction in current can also be effected, instead of disconnecting the chain affected by the fault or the consumer load affected by the fault. For example, if an overload is imminent, the power or the current transmitted via the electronic switch can be reduced such that operation of the connected components is still possible. To this end for example the current and/or the voltage of the corresponding chain can be reduced. By limiting the current, for example for an ohmic consumer load by reducing the voltage, the chain can then remain in operation with reduced power. By the voltage being reduced, a regulated electrical consumer load such as a power converter for example, can additionally recognize that the available power is limited and then automatically carries out a reduction in power.

Besides the straightforward reduction in power, a source with an increased internal resistance can also be emulated. This high internal resistance that is then present prevents damage or destruction in the chain affected by the fault thanks to a reduction in current, such that sensitive loads can still be supplied with power with a switch of this type even in the event of a fault and do not have to be abruptly disconnected. Only if this reduction in power, defined for example by way of a maximum current value or an internal resistance of a virtual source, does not lead to the desired result can the chain be completely isolated from the rest of the power supply system by means of a switching action into the nonconductive state of the electronic switch. Multiple trigger thresholds can then be defined for this purpose. Up to a specified first limit value the electronic switch is in the ON switching state. Above this first limit value the electronic switch reduces the current and/or the voltage, such that the transmitted power or the transmitted current is reduced. Only at a second limit value, which is expediently greater than the first limit value, is the switch displaced into the OFF state. The limit values can for example be currents, voltages or powers.

This works both for networks or systems using an alternating voltage and for networks or systems using a direct voltage.

One of the advantages of pulse-width-modulated operation as a third state of the electronic switch besides the ON state and the OFF state is that parts of the power supply network do not compulsorily have to be disconnected in the event of a fault, but can continue in operation providing the subnetwork can be protected against overload thanks to control/regulation of the flow of power. This can happen for example either directly (ohmic load automatically reduces power at lower supply voltage) or indirectly in that a controlled or regulated electrical consumer load (for example a power converter, a battery charging device, etc.) recognizes the lower supply voltage and then uses its own regulation/control to reduce the power consumed. In this way the availability of the power supply system is considerably increased and at the same time the second limit value means that the security against overload can be ensured just as reliably as with a mechanical switch.

In an advantageous embodiment of the invention the electronic switch has two semiconductor switches, wherein the semiconductor switches are arranged such that a current can be disconnected regardless of the direction of flow of the current through the electronic switch. In the event that the semiconductor switches are reverse-conducting, the semiconductor switch has a diode in parallel to its switching element, which guides a current through the switching element in the opposite direction to the current. The switching element and the diode are then arranged antiparallel. In this case the semiconductor switches are arranged in a series circuit such that a current flows through the switching element of the first semiconductor switch and through the diode of the second semiconductor switch with a first direction of flow of the current. A reverse current flows through the switching element of the second semiconductor switch and the diode of the first semiconductor switch.

In the event that the semiconductor switches are embodied as reverse-blocking, in other words can only carry and disconnect a current in one direction, the semiconductor switches have only one switching element. To be able to carry and disconnect a current regardless of the direction of flow of the current through the electronic switch, the semiconductor switches are arranged in a parallel circuit. In this case the semiconductor switches are arranged antiparallel. This means that a current flows through the switching element of the first semiconductor switch with a first direction of flow of the current and a current flowing in the reverse direction of flow of the current through the electronic switch flows through the switching element of the second semiconductor switch.

The advantage of this arrangement is that even regenerative loads can be safely isolated from a power source. In addition, a switch of this type also enables different power distribution networks or power transmission networks to be connected together in a manner enabling isolation.

In a further advantageous embodiment of the invention the electronic switch has a current sensor, wherein the phase control factor of the pulse-width modulation can be determined as a function of measurement values of the current sensor. The current sensor is in particular advantageous if the current through the electronic switch is to be controlled or regulated. The measurement value of the current can then be used directly in the regulation of the electronic switch. In fault-free operation, which can be recognized on the basis of the current measurement value, the electronic switch remains in the ON state. Two limit values can then be established for protection. If a first limit value is exceeded, the switch is operated by pulse-width modulation, in order to limit the current. If a second limit value is exceeded, which is greater than the first limit value, the electronic switch is then switched off.

During operation with pulse-width modulation it has proved to be advantageous for the electronic switch and/or the power supply system to have a current sensor, wherein the phase control factor of the pulse-width modulation is determined as a function of measurement values of the current sensor. If the current should be reduced further, the phase control factor is further reduced. This can take place until the phase control factor has reached the value 0. At this value the electronic switch is open, in other words nonconductive. It is namely particularly advantageous if the current transformer is already arranged in the electronic switch, since its measurement values are thereby also already known to the regulation of the electronic switch without a complex data interface. However, it is also possible to arrange the current sensor outside the electronic switch. It is expedient to arrange it where a current is measured which at least in part flows through the electronic switch, since this current can then be influenced by the electronic switch. In other words, it is advantageous to arrange the current sensor where a current is measured with the current sensor, said current flowing at least in part through the electronic switch.

It is likewise possible to evaluate both a current transformer of the electronic switch and a current transformer elsewhere in the power supply system and from this to determine the phase control factor for the semiconductor switch of the electronic switch.

In a further advantageous embodiment of the invention the power supply system is embodied as a DC network. The application for DC networks is particularly advantageous because the electronic switch is also particularly well suited to switch currents without current zero, which makes it particularly compact compared to a mechanical switch. In addition, the use in DC networks is particularly advantageous since the switch can also be operated as a DC/DC converter in a particularly simple manner by using pulse-width modulation. In a DC/DC converter, unlike in a power converter for AC applications, only one disconnectable semiconductor switch is needed, as is already present in the electronic switch.

To reduce the voltage the semiconductor switch is then controlled by pulse modulation. In this case operation with small electrical losses is possible. In this way a DC/DC converter is realized with the switch, in that a voltage drops across the electronic switch and the output-side voltage (at the load-side terminal of the electronic switch compared to the reference potential) is reduced by this amount compared to the input-side voltage (at the source-side terminal of the electronic switch compared to the reference potential).

In a further advantageous embodiment of the invention the electronic switch is connected to a diode at at least one of its terminals. If with the electronic switch an electrical consumer load is connected to a DC network, it may be advantageous to arrange a diode at the terminal of the electronic switch which is connected to the electrical consumer load. The diode is then arranged between the potentials which supply the electrical consumer load with voltage. In this case the diode is polarized such that it blocks the applied voltage. This is advantageous especially for inductive consumer loads, since by disconnecting the electronic switch overvoltages at the switch and/or at the electrical consumer load are reliably prevented. The diode has no disadvantages if it is arranged on the side of the electronic switch that is connected to the energy source. Hence for universal use of the electronic switch it is possible to fit both terminals of the electronic switch with a corresponding diode each.

In a further advantageous embodiment of the invention the electronic switch is connected to a capacitor at at least one of its terminals. Overvoltages can also arise at the source-side terminal of the electronic switch due to the switching, especially during the pulse-width modulation. The larger the inductive behavior is at this terminal, the larger are the overvoltages. Thanks to a capacitor, which among other things serves for voltage support in a DC network, these overvoltages can be reduced. In this case the switch can also be part of a network filter which is provided in order to eliminate unwanted currents in the power supply system.

In a further advantageous embodiment of the invention the semiconductor switch of the electronic switch is controlled for a length of time by pulse-width modulation during a change between a conductive state and a nonconductive state. This intermediate step from the switched-on state to the switched-off state and/or from the switched-off state to the switched-on state makes the transition for both the subnetworks or also for individual electrical consumer loads as well as energy sources particularly smooth. By this is meant that as a result overvoltages and/or overcurrents, which can affect the service life of the consumer load or of the source, are often reduced or eliminated. Many consumer loads, in particular consumer loads with a capacitive or ohmic-capacitive behavior, cause high switch-on currents. Thanks to this intermediate step these switch-on currents can in part be considerably reduced. It is advantageous for this control or regulation that no measurement value is required for this. The electronic switch can be switched on or off without a sensor and high switch-on currents or voltage fluctuations can thereby be prevented.

To this end, during switch-on the phase control factor can be increased continuously, but not necessarily linearly, from 0% to 100%. During switch-off the phase control factor is then reduced continuously from 100% to 0%, but not necessarily linearly. Thus the intermediate step of pulse-width modulation can be readily integrated into a process of switching between the ON and OFF states.

In a further advantageous embodiment of the invention, with a first phase control factor which is smaller than a second phase control factor, an edge steepness of a pulse of the pulse-width modulation with the first phase control factor is smaller than the edge steepness of a pulse of the pulse-width modulation with the second phase control factor. During an ideal and thus loss-free switching the switching edges are perpendicular. This means an infinite edge steepness is present. In reality a length of time will always pass, albeit only a very small one, in which the switch is transferred from the conductive to the nonconductive state and the voltage changes accordingly at the load-side terminal. Since voltage is present at the semiconductor switch during the transition, as is current through the semiconductor switch, electrical losses occur during the switching operation. These losses become greater if the edge steepness decreases. Positive use can be made of this behavior. If the semiconductor switch is operated in pulse-width modulation, it can be assumed that there is probably a fault or at least an undesired effect in the power supply system. If the phase control factor is also already correspondingly small, in order to limit the current, this means that even if the electronic switch is already being operated close to the limit for the open state, a high current is still always present. This could point to a short-circuit or fluctuations in the power supply system. Because of the high currents, further fluctuations can also be excited in the power supply system. However, losses are necessary in order to damp fluctuations. With a low phase control factor in the form of lower edge steepnesses these can then easily be introduced into the power supply system and can thus easily stabilize it. Furthermore, the frequency spectrum is considerably smaller with a low edge steepness, such that it becomes significantly less likely that resonances present in the network will be excited. Thus excitations in the power supply system are eliminated and a damping behavior is even generated with the reduced edge steepnesses. Together, the power supply system can thus be stabilized.

This function is very robust, since measurement values for the control are also not needed for it. It has been shown that especially with small phase control factors in which a large spare control capacity for limiting the power and/or the current are already used, the power supply system can easily be stabilized thanks to a low edge steepness during pulsing of the semiconductor switch. At the same time a two-stage concept is realized in which in a first stage the pulse-width modulation attempts to limit currents and only in a second stage, in which the pulse-width modulation reaches the limits of its control options, is the power supply system stabilized and damped in the semiconductor switch by generated losses. The losses cause an ohmic behavior, which further reduces the transmitted currents and powers.

BRIEF DESCRIPTION OF THE DRAWING

The invention is described and explained in greater detail below on the basis of the exemplary embodiments illustrated in the figures, in which.

DETAILED DESCRIPTION OF PREFERRED EMBODIMENTS

Figure 1:
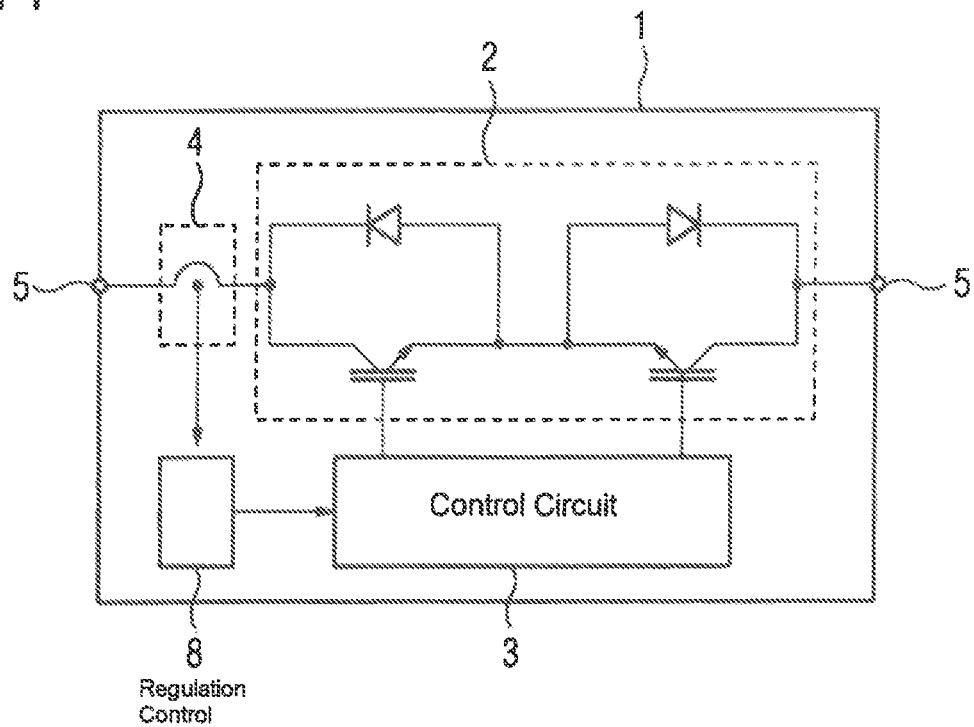
FIG. 1 shows an electronic switch.

FIG. 1 shows an electronic switch 1. This has a semiconductor switch 2 which with its two semiconductors can carry and disconnect a current in both directions. The semiconductor switch 2 with its two semiconductors is controlled by a control circuit 3. This control circuit 3 enables the semiconductor switch 2, and thus the semiconductors arranged therein, to be operated in a switched-on state and by pulse-width modulation. The switched-on state is also known as the conductive state, closed state or ON state. The switched-off state is also known as the nonconductive state, open state or OFF state. In pulse-width-modulated operation the semiconductor switch 2 is pulsed with the pulse frequency. The time ratio of switched-on state to switched-off state gives the output voltage at the output of the electronic switch 1 on average over time. The ratio of length of time of the switched-on state to period duration (which corresponds to the inverse value of the pulse frequency) is the phase control factor a. The determination or calculation of the phase control factor a can take place by the regulation/control 8 of the electronic switch 1 as a function of measurement values of a current transformer 4. This can, as illustrated, be arranged in the electronic switch 1 or can be located elsewhere in the power supply system 10. It is also possible, during operation of the electronic switch 1, to provide the pulse-width modulation regardless of measurement values of a current sensor 4. Corresponding regulation would then be without a sensor.

With pulse-width modulation, currents or powers through the electronic switch 1 can then be reduced. In addition, it is also possible, by adjusting the edge steepness in the pulses of the pulse-width modulation by means of electrical losses, to have a stabilizing and current-reducing effect on the power supply system 10.

Figure 2:
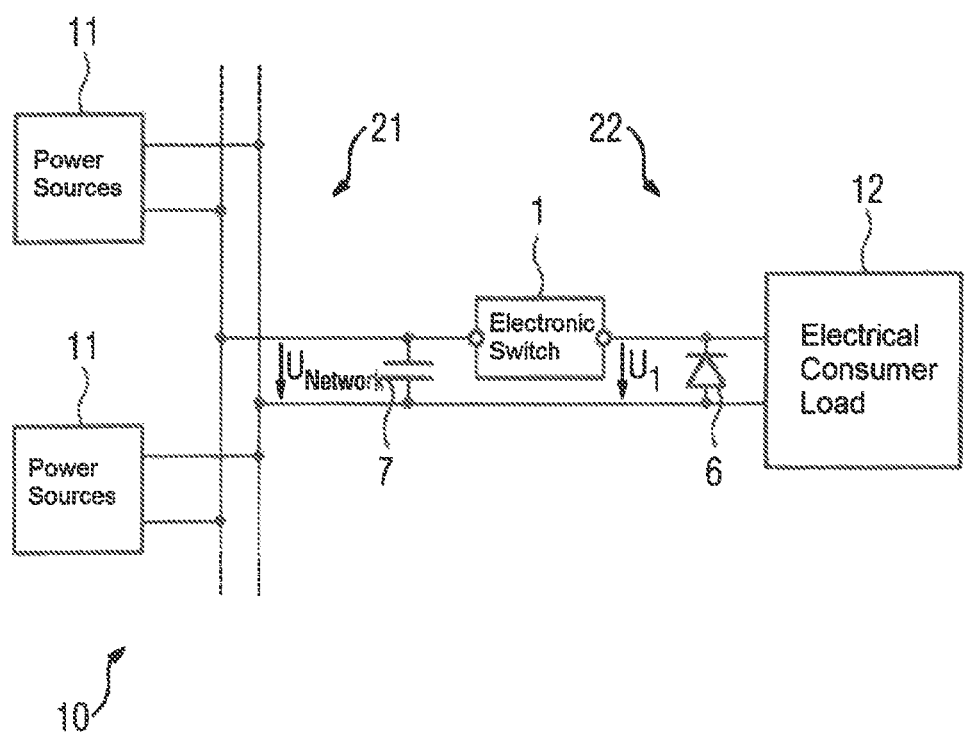
FIG. 2 shows a power supply system.

FIG. 2 shows a power supply system 10, in which by means of the electronic switch 1 a first part 21 of the power supply system 10 is connected to a second part 22 of the power supply system 10. The first part 21 in this case has power sources 11 which supply the power supply system 10 with electrical power. The second part 22 has an electrical consumer load 12. With the aid of the electrical switch 1 this can be isolated from the power supply. In addition, both parts 21, 22 can, as subnetworks, each have further power sources 11 and electrical consumer loads 12. To improve the switching behavior, a capacitor 7 is arranged at the source-side terminal 5 of the electronic switch 1. This reduces possible overvoltages during switching actions at the electronic switch 1. Furthermore, the capacitor 7 supports the input voltage at the electronic switch 1, if said power supply system 10 is embodied as a DC network, and thus has a positive effect on the stability of the power supply network 10. To protect against further overvoltages at the electronic switch 1 or at the electrical consumer load 12, a diode 6 is arranged at the load-side terminal 5 of the electronic switch 1. Use of this only makes sense in a DC network and here it protects the components, in particular inductive loads as electrical consumer loads 12, against an overvoltage.

To measure currents that are to be regulated by the electronic switch 1, the current sensor 4 can moreover, additionally or alternatively to a current sensor 4 in the electronic switch 1, also be arranged elsewhere in the power supply system 10 outside the electronic switch 1. In this case the measured current at least should flow at least in part through the electronic switch 1 which accepts the measurement values from the corresponding transformer.

The network voltage $U_{Network}$ is applied to the source-side terminal 5 of the electronic switch 1, whereas the output voltage $U_1$ is applied to the load-side terminal 5 of the electronic switch 1. The time progression during operation with pulse-width modulation is described and explained in greater detail in the following figures.

Figure 3:
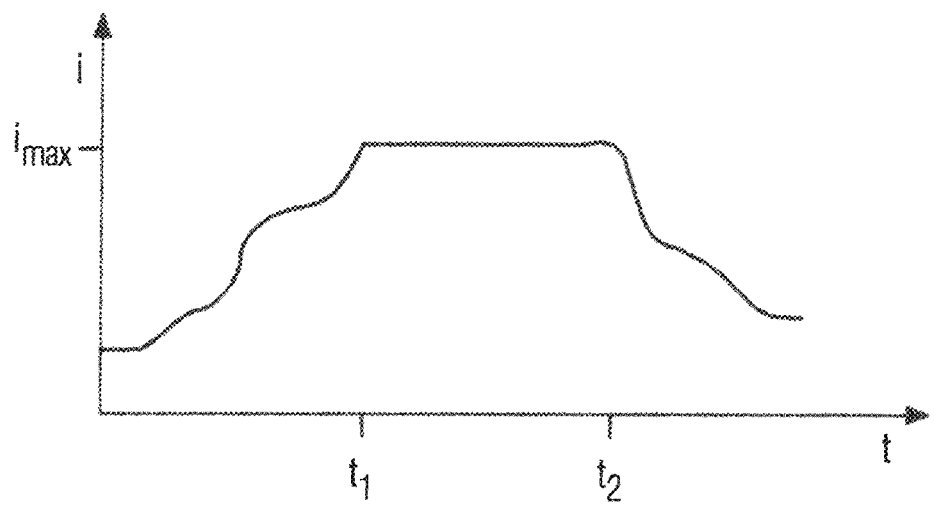
FIG. 3 to FIG. 6 show time progressions of various variables.
Figure 4:
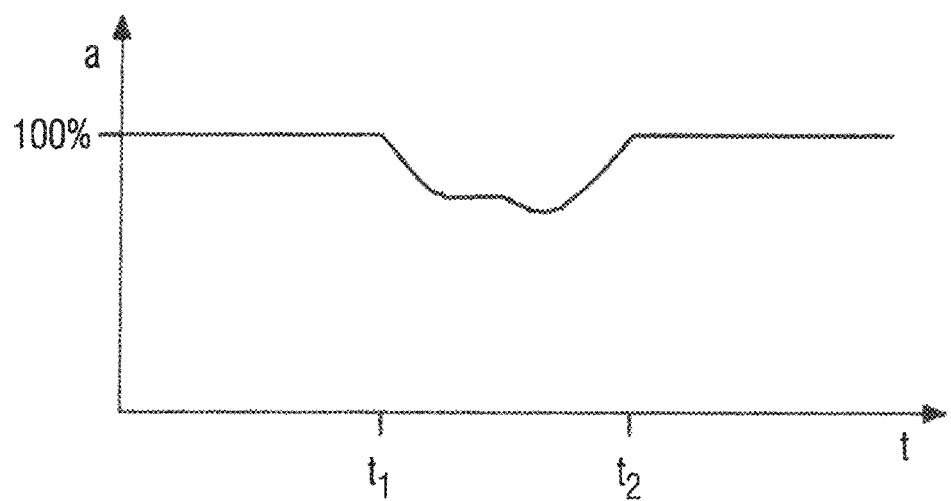

FIG. 3 shows by way of example a time progression of a current consumed by a consumer load 12 which is located for example in an arrangement according to FIG. 2. FIG. 4 shows the associated time progression of the phase control factor a of the electronic switch 1, which connects the electrical consumer load 12 to the power sources 11. Up until time $t_1$ the switch is switched on, which can be recognized by the phase control factor of 100%. At this time $t_1$ the current reaches its maximum permissible value and threatens to exceed this value. As of this time the electronic switch 1 is operated with pulse-width modulation. The regulation reduces the phase control factor to values below 100% and thus keeps the current at a constant value, for example at the maximum permissible value. At time t2 an overload is no longer present. The electronic switch 1 is again switched on (phase control factor is 100%) and the electrical consumer load 12 consumes the necessary current, which is below the permissible value.

Figure 5:
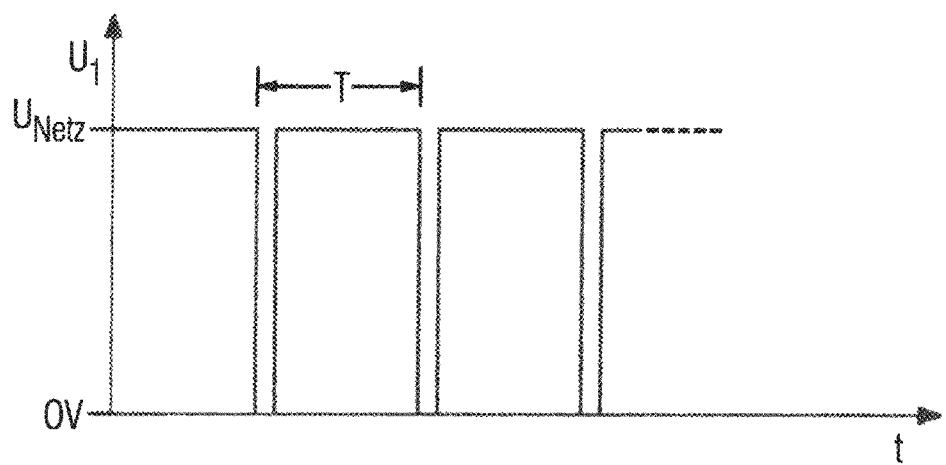

FIG. 5 shows a time progression of the voltage $U_1$ at the load-side terminal of the semiconductor switch 2 compared to a reference potential in the case of a high phase control factor a. The period duration T of the switching actions is plotted. If the electronic switch is switched on, in other words conductive, the network voltage $U_{Network}$ is present at the load-side terminal compared to the reference potential. In the switched-off state 0V is present.

Figure 6:
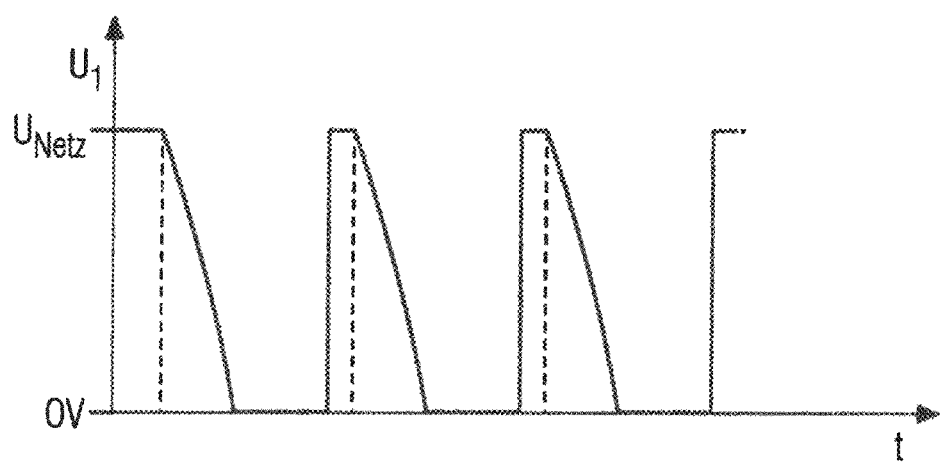

Since the time in the ON state is significantly greater than the time in the OFF state, the phase control factor is significantly above 50%. With these high phase control factors the losses should be kept as low as possible. Hence the switching edges are illustrated as virtually perpendicular. This corresponds to a high edge steepness, in particular an infinite edge steepness. However, FIG. 6 shows a comparable time progression with a relatively low phase control factor a of significantly below 50%. Here the losses of the semiconductor switch 2 can definitely have a damping and current-reducing effect on the power supply system 10, in particular on the electrical consumer load 12. Hence it has proved to be advantageous to reduce the steepness of the switching edges with a decreasing phase control factor a. The edge steepness is therefore also less with a low phase control factor a. Thus for example with values of the phase control factor of above 50% the edge steepness can assume the maximum value achievable by the control circuit, whereas with phase control factors a below 50% it is reduced continuously or in stages. Any number of stages can be selected here. This reduction can refer to the failing edge, as illustrated in FIG. 6, or to the rising edge. Furthermore, both switching edges, i.e. the falling and the rising edge, can be provided with a reduced edge steepness. Also shown, as a dashed line, is the time progression of the voltage at the load-side terminal of the electronic switch compared to the reference potential, if no reduction of the edge steepness is effected.

In summary, the invention relates to an electronic switch having a semiconductor switch comprising a control circuit. To improve the electronic switch it is proposed that the control circuit be designed to operate the semiconductor switch by pulse-width modulation. The invention further relates to a power supply system, having an electronic switch of this type, wherein the electronic switch connects a first part of the power supply system to a second part of the power supply system in a manner enabling isolation. The invention further relates to a method for operating an electronic switch of this type or a power supply system of this type, wherein the semiconductor switch of the electronic switch is controlled at least intermittently by pulse-width modulation.

What is claimed is:

1. An electronic switch, comprising:
   a current sensor; and
   a semiconductor switch comprising two semiconductors configured to carry and disconnect a current in both directions, and a control circuit configured to operate the semiconductor switch by pulse-width modulation and to determine a phase control factor of the pulse-width modulation as a function of measurement values of the current sensor such that in fault-free operation, the electronic switch remains in the ON state and that two limit values exist for protection, wherein the electronic switch is operated by pulse-width modulation when a first one of the two limit values is exceeded, and wherein the electronic switch is switched off when a second one of the two limit values, which is greater than the first limit value, is exceeded,
   wherein the electronic switch is configured to reduce an edge steepness of a switching edge of the pulse-width modulation as the phase control factor decreases.

2. A power supply system, comprising:
   first and second parts; and
   an electronic switch configured to connect the first part to the second part in a manner enabling isolation, said electronic switch comprising a current sensor, and a semiconductor switch comprising two semiconductors configured to carry and disconnect a current in both directions, and a control circuit configured to operate the semiconductor switch by pulse-width modulation and to determine a phase control factor of the pulse-width modulation as a function of measurement values of the current sensor such that in fault-free operation, the electronic switch remains in the ON state and that two limit values exist for protection, wherein the electronic switch is operated by pulse-width modulation when a first one of the two limit values is exceeded, and wherein the electronic switch is switched off when a second one of the two limit values, which is greater than the first limit value, is exceeded, wherein the electronic switch is configured to reduce an edge steepness of a switching edge of the pulse-width modulation as the phase control factor decreases.

3. The power supply system of claim 2, wherein the power supply system is designed as a DC network.

4. The power supply system of claim 2, further comprising a diode connected to a terminal of the electronic switch to prevent an overvoltage at the electronic switch.

5. The power supply system of claim 2, wherein the electronic switch includes two terminals, and further comprising two diodes connected to the two terminals, respectively, to prevent an overvoltage at the electronic switch.

6. The power supply system of claim 2, further comprising a capacitor connected to a terminal of the electronic switch.

7. A method for operating an electronic switch, said method comprising:
   controlling at least intermittently by pulse-width modulation a semiconductor switch configured to carry and disconnect a current in both directions;
   determining a phase control factor of the pulse-width modulation as a function of measurement values of the current sensor such that the electronic switch remains in the ON state in fault-free operation;
   using two limit values for protection such the electronic switch is operated by pulse-width modulation when a first limit value is exceeded, and the electronic switch is switched off when a second one of the two limit values, which is greater than the first limit value, is exceeded; and
   rendering an edge steepness of a pulse of the pulse-width modulation with a first phase control factor that is smaller than a second phase control factor such that the edge steepness of the pulse with the first phase control factor is smaller than the edge steepness of the pulse with the second phase control factor.

8. The method of claim 7, wherein during a change between a conductive state and a nonconductive state the semiconductor switch of the electronic switch is controlled for a length of time by pulse-width modulation, and further comprising continuously increasing the phase control factor during switch-on from 0% to 100%, and continuously reducing the phase control factor during switch-off from 100% to 0%.

* * * * *